United States Patent [19]

Komatsu

[11] Patent Number: 4,644,170
[45] Date of Patent: Feb. 17, 1987

[54] METHOD OF ELECTRON BEAM EXPOSURE

[75] Inventor: Fumio Komatsu, Tokyo, Japan

[73] Assignee: Tokyo Shibaura Denki Kabushiki Kaisha, Japan

[21] Appl. No.: 810,848

[22] Filed: Dec. 20, 1985

Related U.S. Application Data

[63] Continuation of Ser. No. 509,029, Jun. 29, 1983, abandoned.

[30] Foreign Application Priority Data

Jun. 30, 1982 [JP] Japan ............................ 57-112986

[51] Int. Cl.⁴ ........................................... H01J 37/302
[52] U.S. Cl. .................................. 250/492.2; 250/398
[58] Field of Search .............................. 250/492.2, 398

[56] References Cited

U.S. PATENT DOCUMENTS 4,298,803 11/1981 Matsuura et al. ................ 250/492.2

FOREIGN PATENT DOCUMENTS 2852961 6/1980 Fed. Rep. of Germany .
2927242 1/1981 Fed. Rep. of Germany .
2151130 4/1973 France .
2375665 7/1978 France .
56-112729 9/1981 Japan .

OTHER PUBLICATIONS

Ma, et al., "Proximity Corrections in a Raster Scan Electron Lithography Machine," J. Vac. Sci. Technol, 19(4) Nov/Dec. 1981, pp. 1275–1278, 1981.
James S. Greenwich, Electron-Beam Processes, Electron-Beam Technology in Microelectronic Fabrication; G. R. Brewer (Edited); Academic Press; 1980, pp. 97–99.

Primary Examiner—Bruce C. Anderson
Assistant Examiner—Jack I. Berman
Attorney, Agent, or Firm—Finnegan, Henderson, Farabow, Garrett & Dunner

[57] ABSTRACT

A method of electron beam exposure comprising selectively exposing a resist film on a substrate a plurality of times with an electron beam whose dose is lower than a desired dose sufficient to produce a difference in molecular weight between the exposed area and the nonexposed area, the cumulative dose corresponding to said desired dose.

9 Claims, 13 Drawing Figures

METHOD OF ELECTRON BEAM EXPOSURE

This application is a continuation of application Ser. No. 509,029, filed June 29, 1983, now abandoned.

BACKGROUND OF THE INVENTION

This invention relates to an improved method of electron beam exposure.

Figure 1:
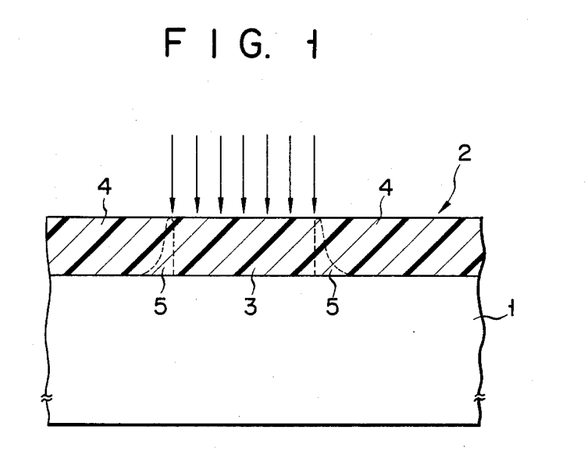
FIG. 1 shows a cross-sectional view for explaining the generation of a proximity effect resulting from the exposure of an electron beam.

As a result of the microminiaturization and high packing density of semiconductor elements, a certain lithography technique using the electron beam exposure method has recently been highlighted as a submicron patterning technique. This electron beam exposure method exposes a positive type (or a negative type) resist film 2 on a mask or a semiconductor substrate 1 as shown in FIG. 1, while scanning it with an electron beam. In this method, however, a portion 5 of a marginal area 4 other than a desired exposure area 3 is exposed due to the forward-scattered beams in the resist film 2 and the backward-scattered beams from the substrate 1, causing a problem of what is called "proximity effects", that is, causing the deformation of a pattern configuration. "Proximity Corrections in a Raster Scan Electron Lithography Machine" (S. K. S. Ma, M. Parikh and W. Ward ), which appeared in J. Vac, Scl. Technol., 19(4), November/December 1981 describes a method for reducing the proximity effect caused by the electron beam exposure. According to this method, when a specific pattern and an adjacent narrow pattern are to be formed, the spacing, etc. of these patterns is initially calculated through simulation and an optimal dose of an electron beam corresponding to each pattern is selected based on the pattern data, thereby reducing the proximity effect. This method takes a relatively long time when the raster scan electron lithography machine is used. In order to identify pattern data involving the proximity data and process it, it is necessary to perform processing by both a main frame computer and minicomputers. In this case, a relatively long time is required even using the main frame computer. In the raster scan electron lithography machine, not only the whole surface of the exposure area, but also the whole surface of the data area must be scanned, also requiring a considerable length of time.

SUMMARY OF THE INVENTION

One object of this invention is to provide a method of electron beam exposure in which, when a resist film on a substrate is exposed with an electron beam, the scattering of the electron beam in the resist film and the backward beam scattering from the substrate can be suppressed by a simple operation to permit reduction of a proximity effect.

Another object of this invention is to provide a method of electron beam exposure in which, when a resist film on a substrate is exposed with an electron beam, the difference in the number-average molecular weight between the exposed area and the marginal area in the resist film is increased by a simple operation to permit the reduction of a proximity effect.

According to this invention, there is provided a method of forming a pattern on a resist film disposed on a substrate by exposing the portions of the resist film containing the pattern with an electron beam, the electron beam being directed onto the resist film a plurality of times at a fractional dose lower than a desired dose sufficient to produce a difference in molecular weight between the exposed area and the nonexposed area, the sum of the fractional doses corresponding to the desired dose. Here, the desired dose means a dose determined so that, for the positive type resist film, the number average molecular weight (initial number average molecular weight) of the exposed area is less than two-thirds that of the nonexposed area and that, for the negative type resist film, the number average molecular weight (initial number average molecular weight) of the exposed area is two or more times greater than the nonexposed area.

DETAILED DESCRIPTION OF THE PREFERRED EMBODIMENT

Examples of this invention will be explained below by referring to the accompanying drawings.

EXAMPLE 1

Figure 2:
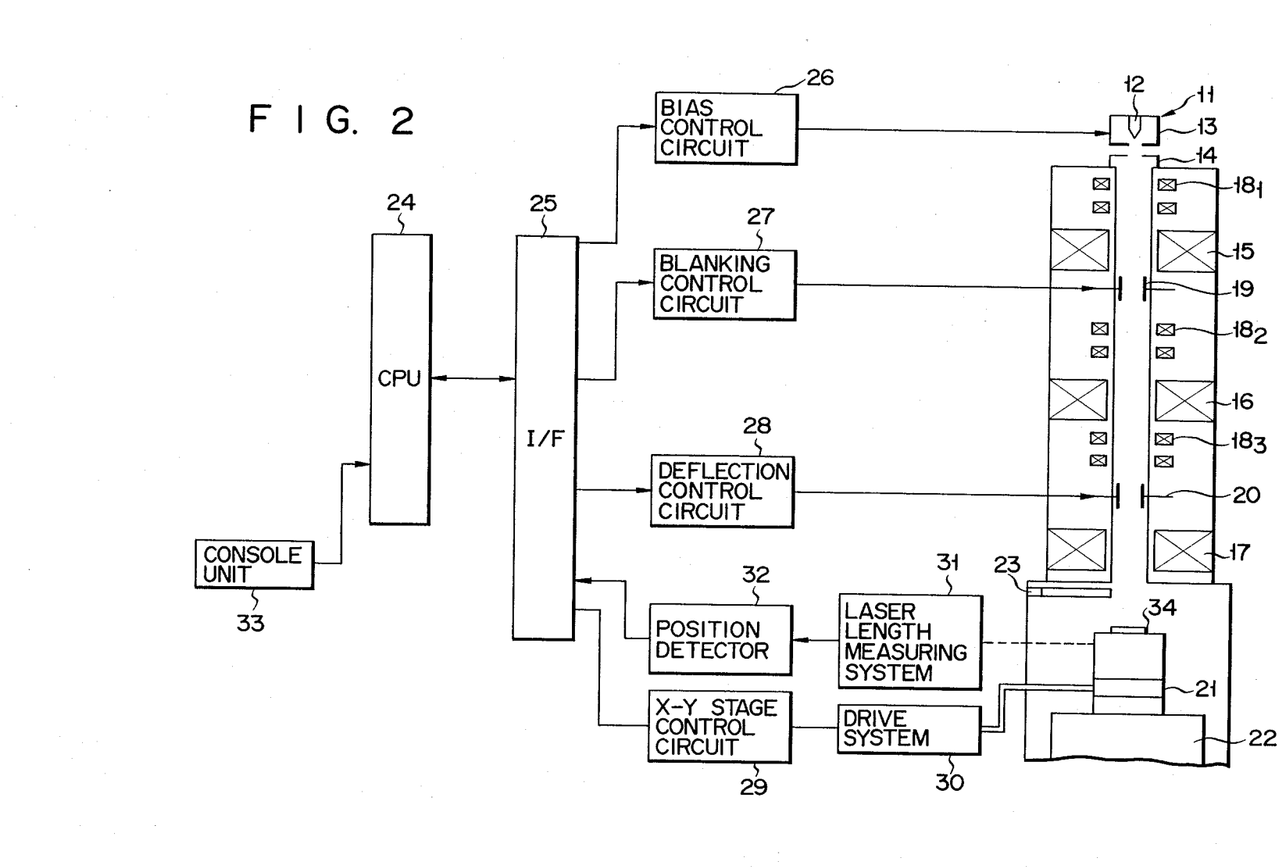
FIG. 2 is a diagrammatic view showing a raster scan type electron beam exposing apparatus using an electron beam exposing method of this invention.

FIG. 2 is a diagrammatic view showing a raster scan type electron beam exposing apparatus used in this invention. An electron gun 11 includes a cathode 12, a Wehnelt electrode 13 enclosing the cathode 12 and an anode 14 disposed opposite to the Wehnelt electrode 13. A first condenser lens 15, second condenser lens 16 and objective lens 17 constituting an electromagnetic lens are vertically arranged, at predetermined distances, below the electron gun 11. An alignment coil $18_1$ is disposed between the electron gun 11 and the first condenser lens 15, an alignment coil $18_2$ between the first and second condenser lenses 15 and 16, and an alignment coil $18_3$ between the second condenser lens 16 and the objective lens 17. These alignment coils $18_1 \sim 18_3$ are adapted to align an optical axis of electron beams. A blanking electrode 19 for effecting ON-OFF control of the electron beam is arranged between the first condenser lens 15 and the alignment coil $18_2$. A deflecting plate 20 for scanning the electron beam is disposed between the alignment coil $18_3$ and the objective lens 17. Below the objective lens 17 is arranged a stage 21, which is mounted on a base 22 and which is movable in the X, Y directions. A reflection electron detector 23 is located above the stage 21. A CPU 24 is adapted to control predetermined members of the above-mentioned apparatus, and is connected to an interface 25, which in turn is connected to the electron gun 11 through a bias control circuit 26. The control circuit 26 is adapted to control a grid bias between the cathode 12 and the anode 14 of the electron gun 11 to control the flow of the beam. The interface 25 is connected to the blanking electrode 19 through a blanking control circuit 27, to the deflecting plate 20 through a deflection control circuit 28, and to the stage 21 through an X-Y stage control circuit and drive system 30. A laser length measuring system 31 is arranged with respect to the stage 21 and connected to the interface 25 through a position detector 32. A console unit 33 is connected to the CPU 24 to input a dose of the electron beam, beam scanning mode, etc.

A method of electron beam exposure will be explained below using the exposing apparatus of FIG. 2.

Polymethyl methacrylate was spin-coated on a blank mask 34 and prebaked, followed by coating, for example, a 0.5 μm-thick positive type resist layer on the resultant structure. The blank mask 34 was fixed on the stage 21 through a cassette (not shown).

Figure 3:
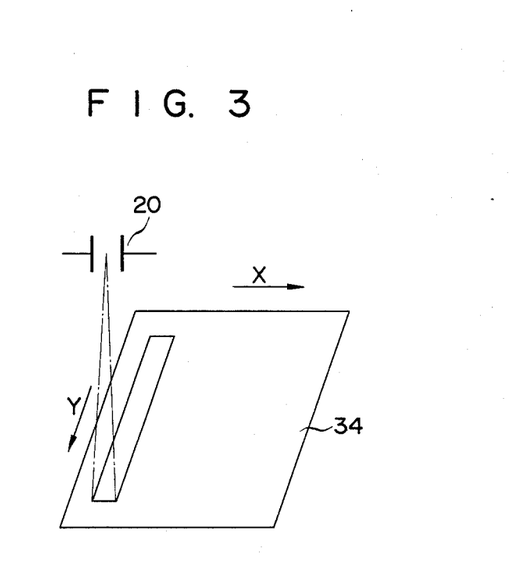
FIG. 3 illustrates the exposure of an electron beam using the method of this invention.

Various data from the console unit 33 were input to the CPU 24. The CPU 24 operated the bias control circuit 26, blanking control circuit 27, deflection control circuit 28 and X-Y stage control circuit 29 through the interface 25. While an electron beam was scanned on the positive type resist film on the blank mask 34 with an address unit of 0.5 μm, a beam current of 400 nA and exposure time per dot of 25 n sec, the blank mask 34 was moved in the Y direction to perform a first exposure in the Y direction as shown in FIG. 3. Then, the stage 21 was returned to an original drawing start point and the second exposure was effected on a previously drawn resist film area under the same conditions as mentioned above. Then, the stage 21 was stepped in the X direction and exposure was made with the electron beam in the same way. Thereafter, the exposed positive type resist film was subjected to a development step as shown in FIG. 4 to form a resist pattern 35.

CONTROL 1

Figure 5:
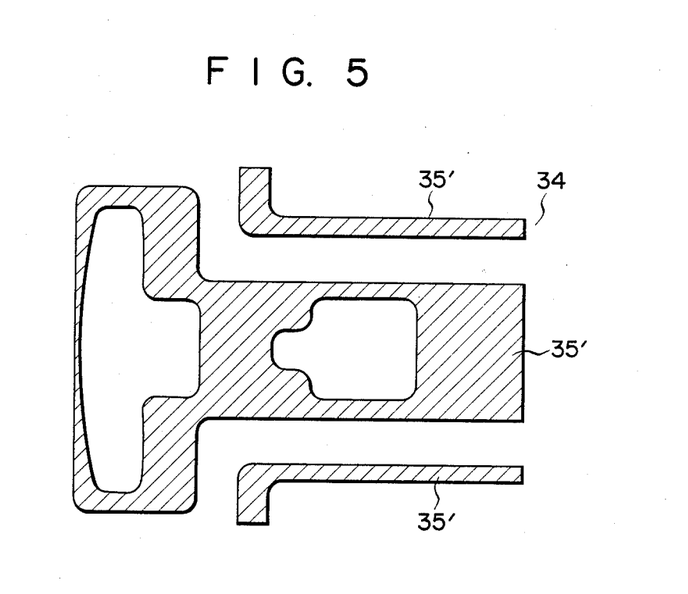
FIG. 5 is a plan view showing a resist pattern formed by a conventional exposing method in which an electron beam is directed one time.

Polymethyl methacrylate was spin-coated on a blank mask and baked, followed by coating a 0.5 μm-thick resist film of a positive type. Then, the blank mask was fixed on the stage 21 of FIG. 2 through a cassette and an electron beam was directed onto the resist film with an address unit of 0.5 μm, beam current of 400 nA and exposure time per dot of 50 n sec to perform the first exposure. At this time, the number average molecular weight of the exposed area of the resist film was reduced to one-third the original number average molecular weight of the nonexposed are of the resist film. Then, the exposed resist film was subjected to a development step to form a resist pattern 35' as shown in FIG. 5.

Figure 4:
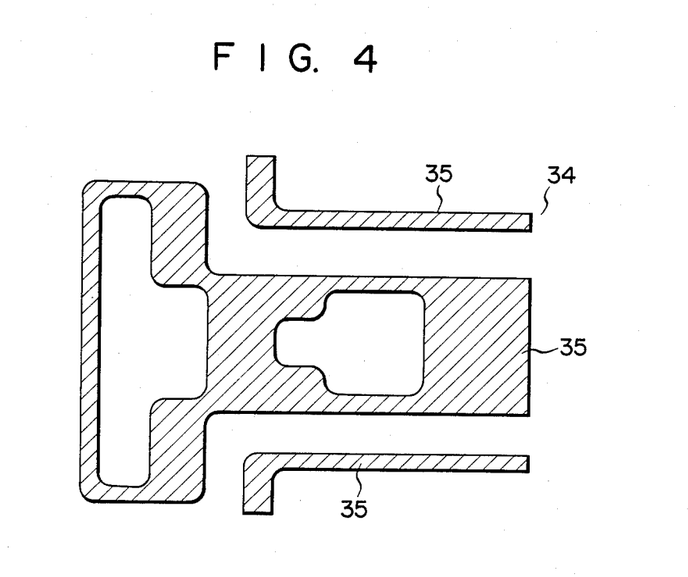
FIG. 4 is a plan view showing a resist pattern formed by the method of this invention.

According to the method of Example 1, the marginal area of the pattern was substantially free from any defective curve which might otherwise be formed due to the proximity effect, thus forming a resist pattern 35 as shown in FIG. 4 which was faithful to the pattern data. In the method of Control 1, a resist pattern 35' was formed in which a defective curve was formed on the marginal area of the pattern due to the proximity effect.

Figure 6:
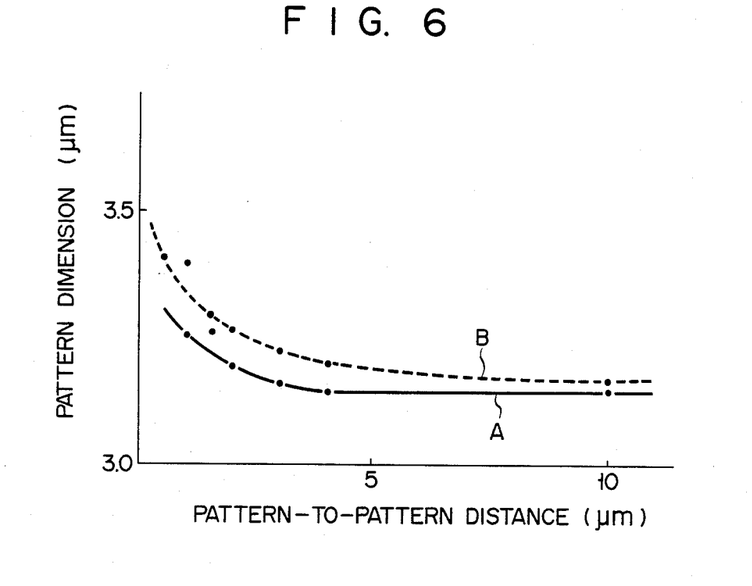
FIG. 6 illustrates a curve showing a relation of a variation of a pattern dimension to a variation in a distance between 3 $\mu$m (based on data) patterns formed under the same development conditions after using the conventional exposing method and a first example of the method of this invention.

A plurality of 3 μm (based on data) patterns were formed according to the methods of Example 1 and Control 1 and a relation of a pattern dimension to a variation in a distance between the patterns was examined to obtain a curve as shown in FIG. 6. In FIG. 6, A shows the characteristic curve representing a variation of the pattern dimension as obtained according to the method of Example 1 and B shows the characteristic curve representing a variation of the pattern dimension as obtained according to the method of Control 1. As evident from FIG. 6, in Control 1 in which the electron beam exposure was effected once, the pattern dimension markedly varies if the pattern-to-pattern distance is shorter than 3.0 μm. In the method of Example 1, in which the first and second exposures were effected with the electron beam whose dose was one half the desired dose, a variation in the pattern dimension can be suppressed due to a decrease in the proximity effect, even if the pattern-to-pattern distance is shorter than 3.0 μm. According to the method of Example 1, the proximity effect can be decreased in comparison with that of Control 1, the reason is as follows.

A lower density exposure area was subjected to the first electron beam exposure to cause the main chains of the area to be initially broken (in the case of a positive type resist film). In the second electron beam exposure, the difference in the number-average molecular weight between the data area and the area affected by the proximity effect was increased in comparison with the difference in the number-average molecular weight between the same areas in the case of Control 1 in which the electron beam exposure was effected once.

Figure 7:
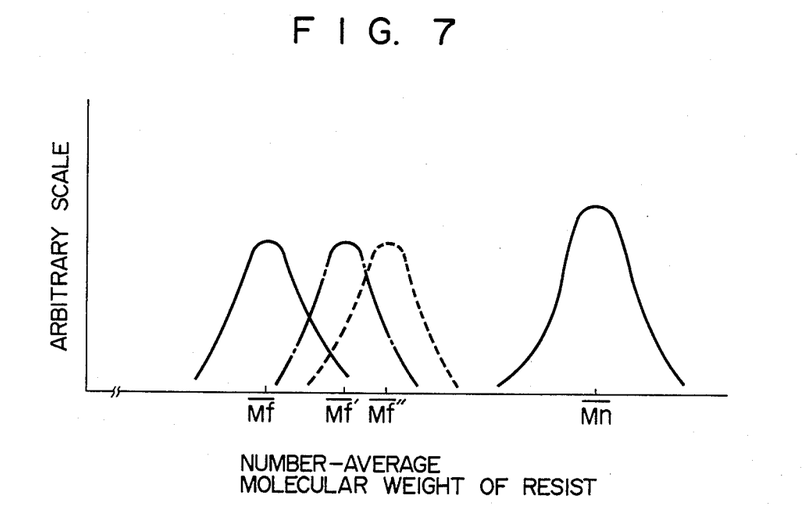
FIG. 7 illustrates a curve showing a distribution of an initial number-average molecular weight ($\overline{M}_n$) as well as the number-average molecular weight ($\overline{M}_f$) of an area exposed by the method of this invention, that ($\overline{M}_f'$) of an area exposed by the conventional exposing method, and that ($\overline{M}_f''$) of an area affected by a proximity effect.

Now suppose that $\overline{M}_n$ denotes the initial number-average molecular weight of the positive type resist film, $\overline{M}_f$ is the number-average molecular weight of an area exposed twice with the electron beam whose dose is one half a dose Qo, $\overline{M}_f$ is the number-average molecular weight of an area exposed once with a dose of electron beam Qo, and $\overline{M}_{f(1)}''$ and $\overline{M}_{f(2)}''$ are the number-average molecular weights of areas affected due to the proximity effects when the areas are exposed once with a full dose and once with one half the dose of the electron beam Qo. In this connection it should be noted that the number-average molecular weights $\overline{M}_n$, $\overline{M}_f$, $\overline{M}_f'$ and $\overline{M}_f''(\overline{M}_{f(1)}'', \overline{M}_{f(2)}'')$ can be represented, as a model, as shown in FIG. 7, and that the following equations were calculated based on the already established data in "Electronic-Beam Technology in Microelectronic Fabrication" G. R. Brewer (Ed.), Academic Press, pp 97 to 99.

(i) With the dose of electron beam Qo, a difference between the number-average molecular weight $\overline{M}_f'$ of the exposed area and the number-average molecular weight $\overline{M}_{f(1)}''$ of the area affected due to the proximity effect is given by:

$$\frac{1}{\overline{M}_n}(\overline{M}_{f(1)}'' - \overline{M}_f') = \frac{1}{1 + \frac{g_s \cdot \epsilon x}{\rho_o N_A}\overline{M}_n} - \frac{1}{1 + \frac{g_s \cdot \epsilon}{\rho_o N_A}\overline{M}_n} \quad (1)$$

$$= \frac{\frac{H}{\rho_o}(1-x)}{\left(1 + \frac{Hx}{\rho_o}\right)\left(1 + \frac{H}{\rho_o}\right)}$$

(ii) When the exposure is effected twice with one half the dose of the electron beam Qo, a difference between the number-average molecular weight $\overline{M}_f'$ of the exposed area and the number-average molecular weight $\overline{M}_{f(2)}''$ of the area affected due to the proximity effect can be expressed as follows:

$$\frac{1}{\overline{M}_n}(\overline{M}_{f(2)}'' - \overline{M}_f') = \frac{1}{1 + \frac{g_s}{N_A}\cdot\frac{\epsilon x}{2}\left(\frac{1}{\rho_o} + \frac{1}{\rho'}\right)\overline{M}_n} - \quad (2)$$

$$\frac{1}{1 + \frac{g_s}{N_A}\cdot\frac{\epsilon}{2}\left(\frac{1}{\rho_o} + \frac{1}{\rho''}\right)\overline{M}_n} =$$

$$\frac{\frac{H}{2\rho_o}(1-x) + \frac{H}{2}\cdot\frac{\rho_o(1-x)}{\rho'\rho''}}{\left\{1 + \frac{Hx}{2}\left(\frac{1}{\rho_o} + \frac{1}{\rho''}\right)\right\}\left\{1 + \frac{H}{2}\left(\frac{1}{\rho_o} + \frac{1}{\rho'}\right)\right\}}$$

Expanding and rearranging the numerator (the numerator is expressed as H(1−x)D) of Equations (2) and (1) yields:

$$D = \left(\frac{1}{2\rho_o} + \frac{Hx}{2\rho_o^2} + \frac{H}{2\rho_o^2} + \frac{H^2x}{2\rho_o^3}\right) +$$

$$\left(\frac{\rho_o}{2\rho'\rho''} + \frac{Hx}{2\rho'\rho''} + \frac{H}{2\rho'\rho''} + \frac{H^2x}{2\rho'\rho''\rho_o}\right) -$$

$$\left(\frac{1}{\rho_o} + \frac{Hx}{2\rho_o^2} + \frac{Hx}{2\rho_o\rho''} + \frac{H}{2\rho_o^2} + \frac{H}{2\rho_o\rho'} + \right.$$

-continued $$\left.\frac{H^2x}{4\rho_o^3} + \frac{H^2x}{4\rho_o^2\rho'} + \frac{H^2x}{4\rho_o^2\rho''} + \frac{H^2x}{4\rho_o\rho'\rho''}\right) =$$

$$\frac{\rho_o}{2}\left(\frac{1}{\rho'\rho''} - \frac{1}{\rho_o^2}\right) + \frac{H}{2\rho'}\left(\frac{1}{\rho''} - \frac{1}{\rho_o}\right) +$$

$$\frac{Hx}{2\rho''}\left(\frac{1}{\rho'} - \frac{1}{\rho_o}\right) + \frac{H^2x}{4\rho_o}\left(\frac{1}{\rho'} - \frac{1}{\rho_o}\right)\left(\frac{1}{\rho''} - \frac{1}{\rho_o}\right) > 0$$

Thus, a relation $$M_{f(2)}'' - M_f' > M_{f(1)}'' - M_f' \quad (3)$$

holds, where
 $g_s$: the number of main chain scissions per unit energy
 $\epsilon$: absorption energy density
 $\rho_o$: the initial density of the resist film
 $N_A$: Avogadro's number $$H = \frac{g_s \cdot \epsilon}{N_A} \cdot \overline{M}_n$$

$$\rho' = \rho_o - C \cdot \frac{\epsilon}{2}, \rho'' = \rho_o - C\frac{\epsilon}{2}x$$

where C: the constant

With the energy density of the exposed area represented by $\epsilon$, at $0 \leq x < 1$ the energy density of the area affected due to the proximity effect can be given by $\epsilon x$.

As evident from Equation (3), when processing is performed under the same development conditions, the area ($\overline{M}_{f(2)}''$) affected due to the proximity effect is less likely to be developed, since the completion of the development step is judged by the exposed area ($\overline{M}_f$). In other words, the area affected due to the proximity effect is less likely to be developed to an extent corresponding to an increase in a difference in the number-average molecular weight between the exposed area and the area affected owing to the proximity effect. It is therefore possible to markedly decrease the proximity effect according to Example 1 as compared with that according to the conventional exposing method.

EXAMPLE 2

A high-sensitivity resist film of a positive type [commercially available under the trade name of EBR-9 (Toray Industries, Inc.)] was spin-coated onto a blank mask and prebaked, followed by coating a 0.6 μm-thick high-sensitivity resist film onto the resultant structure. The high-sensitivity resist film was subjected by the electron beam exposure apparatus (FIG. 2) to a first electron beam exposure with an address unit of 0.5 μm, beam current of 200 nA and exposure time per dot of 25 sec. Then, the resist film area was again exposed with the electron beam under the same conditions. The exposed resist film was developed to form a resist pattern.

CONTROL 2

A 0.6 μm-thick high-sensitivity resist film of a positive type was coated onto a blank mask in the same way as in Example 2. Then, an electron beam was directed once onto the high-sensitivity resist film with an address unit of 0.5 μm, a beam current of 400 nA and an exposure time per dot of 25 n sec, while using the electron beam exposure apparatus of FIG. 2. Then, the exposed high-sensitivity resist film of a positive type was developed to form a resist pattern.

Figure 8:
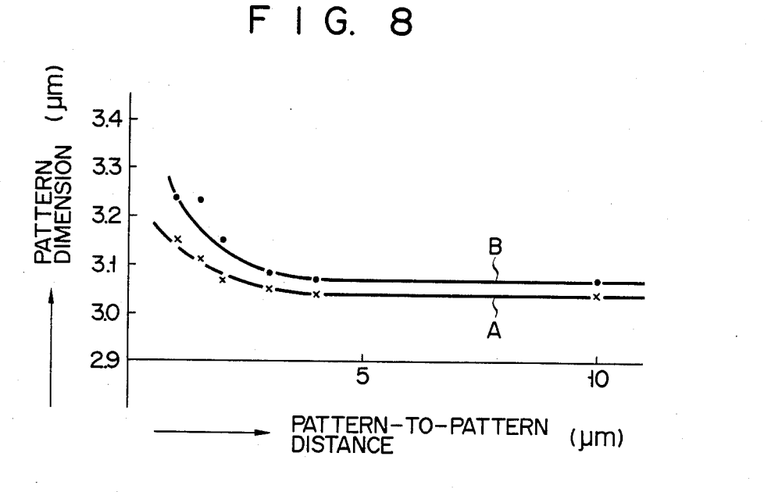
FIG. 8 illustrates a curve showing a relation of a variation of a pattern dimension to a variation in a distance between 3 $\mu$m (based on data) patterns formed under the same development conditions, after using the conventional exposing method and a second example of the exposing method of this invention.

A plurality of 3 μm (based on data) patterns were formed according to the method of Example 2 and the method of control 2. A relation of a variation of the pattern dimension to a variation in a pattern-to-pattern distance was examined to obtain a curve as shown in FIG. 8. In FIG. 8, A illustrates a characteristic curve showing a variation of the pattern dimension according to Example 2 and B illustrates a characteristic curve showing a variation of the pattern dimension according to Control 2.

Figure 9:
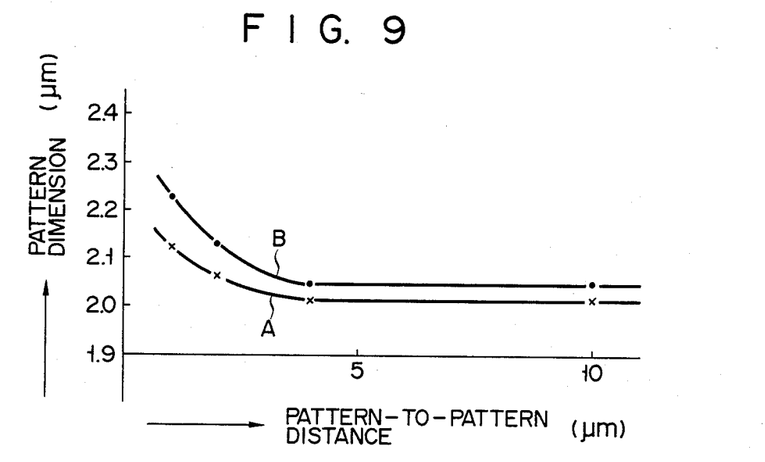
FIG. 9 illustrates a curve showing a relation of a variation of a pattern dimension to a variation in a distance between 2 $\mu$m (based on data) patterns formed under the same conditions after using the conventional exposing method and the second example of the exposing method (as in FIG. 8) of this invention.

A plurality of 2 μm (based on data) patterns were formed according to the methods of Example 2 and Control 2 and a relation of a variation of the pattern dimension to a distance between the patterns was examined to obtain a curve as shown in FIG. 9. In FIG. 9, A illustrates a characteristic curve showing a variation of the pattern dimension according to the method of Example 2 and B illustrates a characteristic curve showing a variation of the pattern dimension according to the method of Control 2.

Figure 10:
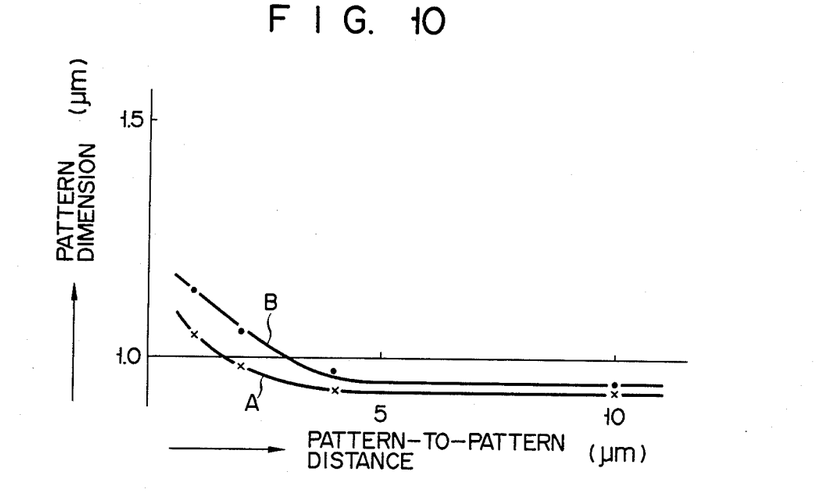
FIG. 10 illustrates a curve showing a relation of a variation of a pattern dimension to a variation in a distance between 1 $\mu$m (based on data) patterns formed under the same development conditions after using the conventional exposing method and the second example of the method (as in FIG. 8) of this invention.

A plurality of 1 μm (based on data) patterns were formed according to the methods of Example 2 and Control 2 and a relation of a variation of the pattern dimension to a variation in a pattern-to-pattern distance was examined to obtain a curve as shown in FIG. 10. In FIG. 10, A illustrates a characteristic curve showing a variation in the pattern dimension according to the method of Example 2 and B illustrates a characteristic curve showing a variation in the pattern dimension according to the method of Control 2.

In Control 2 in which the electron beam exposure was effected once, the pattern dimension markedly varies, as shown in FIGS. 8 to 10, if the pattern-to-pattern distance is shorter than 4.0 μm, as is evident from FIGS. 8 to 10. In Example 2 in which the resist film was exposed twice with one half the desired dose (one half the beam current), it is possible to suppress the variation of the pattern dimension due to a decrease in the proximity effect, even if the pattern-to-pattern distance is shorter than 4.0 μm.

EXAMPLE 3

A 0.5 μm-thick resist film of a positive type made of polymethyl methacrylate was coated on a blank mask according to the same method as in Example 1. An electron beam was directed once, by the electron beam exposure apparatus (FIG. 2), onto the resist film with an address unit of 0.5 μm, beam current of 200 nA and exposure time per dot of 50 n sec. Then, the electron beam was again directed onto the once-exposed resist film area under the same conditions. The exposed resist film was subjected to a development step to form a resist pattern.

Figure 11:
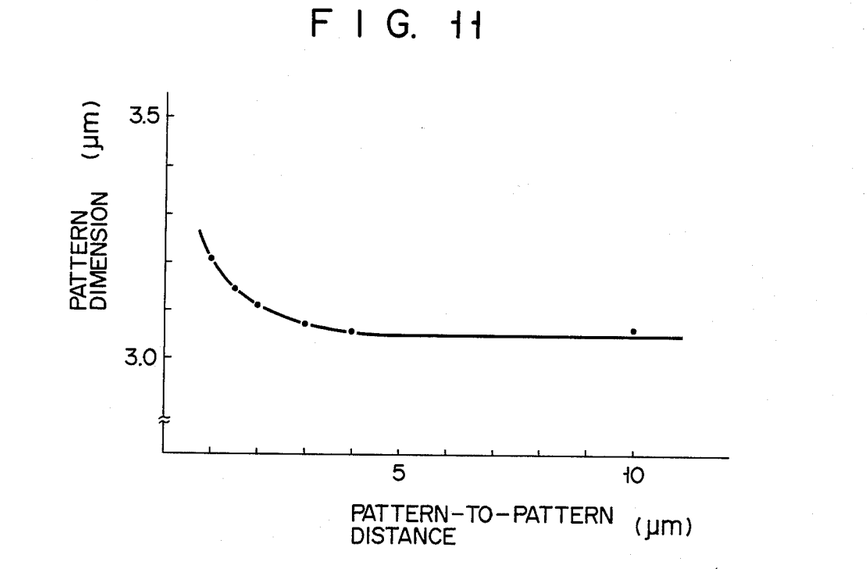
FIG. 11 illustrates a curve showing a relation of a variation of a pattern dimension to a variation in a distance between 3 $\mu$m (based on data) patterns formed by a third example of the exposing method of this invention.

A plurality of 3 μm (based on data) patterns were formed according to the method of Example 3. A relation of a variation of the pattern dimension to the pattern-to-pattern distance was examined, obtaining a curve as shown in FIG. 11. In Example 3, in which the resist film was twice exposed with the electron beam whose dose is one half that of the desired beam, the variation of the pattern dimension can be suppressed, as shown in FIG. 11, owing to a decrease of the proximity effect, as in Example 1 in which the electron beam was twice directed to the resist film during an exposure time per dot which was one half the desired exposure time per dot.

EXAMPLE 4

A 0.5 μm-thick resist film of a positive film made of polymethyl methacrylate was coated on a blank mask using the same method as in Example 1. Then, an electron beam was directed, by the electron beam exposure apparatus (FIG. 2), onto a resist film with an address unit of 0.5 μm, a beam current of 100 nA and an exposure time per dot of 50 n sec. Then, the exposed resist area was exposed three times (four times in total) with the electron beam under the same conditions. The exposed resist film was subjected to a development step to form a resist pattern.

Figure 12:
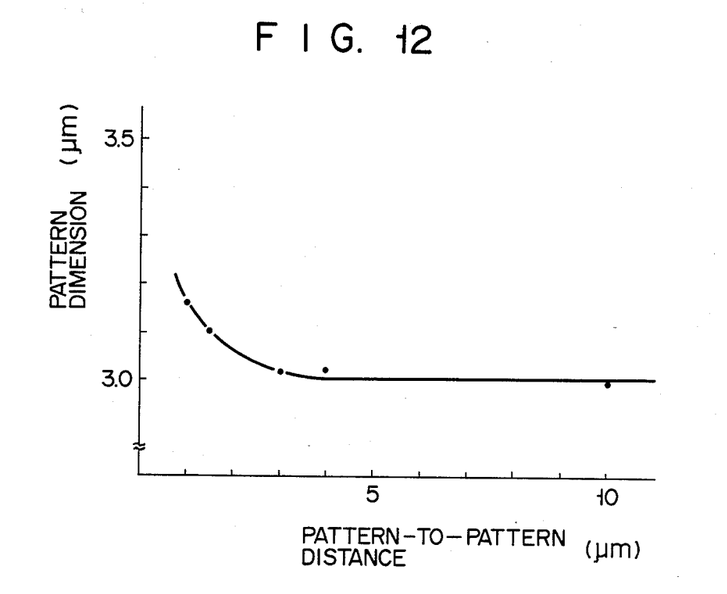
FIG. 12 illustrates a curve showing a relation of a variation of a pattern dimension to a variation in a distance between 3 $\mu$m (based on data) patterns formed by a fourth example of the exposing method of this invention.

A plurality of 3 μm (based on data) patterns were formed by the method of Example 4 and a relation of the variation of a pattern dimension to the variation of a pattern-to-pattern distance was examined to obtain a curve as shown in FIG. 12. In Example 4, in which the resist film was exposed four times with an electron beam whose dose is one-fourth the desired dose, the variation of the pattern dimension can be further suppressed due to a decrease in the proximity effect, as compared with that of Example 3.

EXAMPLE 5

A 0.5 μm-thick resist film of a positive type made of polymethyl methacrylate was coated on a blank mask in the same method as in Example 1. An electron beam was directed onto the resist film twice by the electron beam exposure apparatus (FIG. 2), with an address unit of 0.5 μm, a beam current of 200 nA and an exposure time per dot of 50 n sec. Then, the exposed resist film was developed to form 2 μm (based on the data) patterns at intervals of 2 μm.

The electron beam was directed four times by the electron beam exposure apparatus (FIG. 2) onto the positive type resist film with an address unit of 0.5 μm, beam current of 100 nA and exposure time per dot of 50 n sec. After this exposure, the resist film was developed to obtain 2 μm (based on data) patterns at intervals of 2 μm (based on data).

Figure 13:
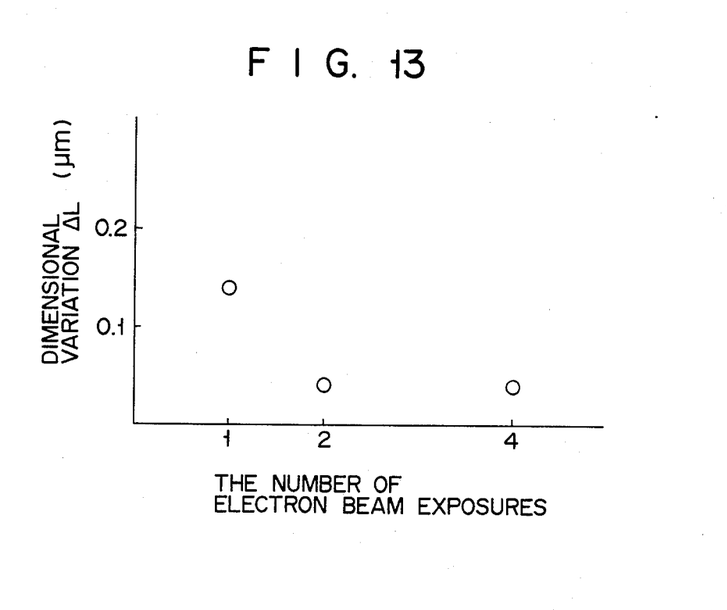
FIG. 13 illustrates a curve showing a variation in a dimension of 2 $\mu$m (based on data) patterns formed at distances of 2 μm (based on data) by a development step after exposures are made twice and four times.

The dimensional variation (ΔL) of the resist patterns formed by the twice-and four-times-exposure methods were examined to obtain a curve as shown in FIG. 13. The dimensional variation (ΔL) was found by subtracting the data value from a dimensional value of measurement of the resist patterns. In FIG. 13, the first exposure was made with an address unit of 0.5 μm, electron beam current of 400 nA and exposure time per dot of 50 n sec, and the exposed resist film was subjected to a development step, forming a 2 μm (based on data) patterns at intervals of 2 μm (based on data). From FIG. 13 it may be seen that, with respect to the dimensional variation resulting from the proximity effect, the single-exposure method results in a larger variation than does the double-exposure method, and a much larger variation than the four-exposure method.

Although in the above-mentioned examples the blank mask was used as the substrate, a semiconductor wafer such as a silicon wafer may be used instead. In the above-mentioned examples, the same result can be obtained even if a negative type resist film is used in place of the positive type resist film.

As mentioned above, this invention provides a method of electron beam exposure, in which a very fine, accurate pattern substantially free from any proximity effect can be obtained by a simple operation, i.e., without using any complicated means such as correction of the pattern data.

What is claimed is:

1. A method of forming a pattern on a resist film disposed on a substrate, comprising the steps of:

exposing the portions of said resist film containing said pattern with an electron beam of a reduced dose that is a fraction of a desired dose while refraining from exposing the portions of said resist film not containing said pattern, said desired dose being sufficient to produce a difference in molecular weight between said patterned portions of said resist film and the nonexposed portions of said resist film; and said fraction having 1 as a numerator and a whole number as a denominator; and performing said exposing step a number of times equal to said denominator of said fraction to expose said portions to a cumulative electron beam dose substantially equal to said desired dose.

2. A method according to claim 1, in which said substrate is a silicon wafer.

3. A method according to claim 1, in which said substrate is a blank mask.

4. A method according to claim 1, in which said reduced electron beam dose has a beam current lower than the current of said desired dose.

5. A method according to claim 4, in which said exposing step is performed twice, and said reduced dose has a beam current one half the current of said desired dose.

6. A method according to claim 4, in which said exposing step is performed thrice, and said reduced dose has a beam current one third the current of said desired dose.

7. A method according to claim 1, in which said reduced electron beam dose has an exposure time shorter than the exposure time of said desired dose.

8. A method according to claim 7, in which said exposing step is performed twice, and said reduced dose has an exposure time one half the exposure time of said desired dose.

9. A method according to claim 7, in which said exposing step is performed thrice, and said reduced dose has an exposure time one third the exposure time of said desired dose.

* * * * *